United States Patent [19]

Murakami et al.

[11] Patent Number: 5,306,696
[45] Date of Patent: Apr. 26, 1994

[54] METHOD OF PRODUCING $YBA_2CU_4O_x$-TYPE SUPERCONDUCTING METAL OXIDES

[75] Inventors: Hirohiko Murakami, Koshigaya; Junya Nishino, Yokohama; Seiji Yaegashi, Urawa; Yu Shiohara; Shoji Tanaka, both of Tokyo, all of Japan

[73] Assignees: Kabushiki-Gaisha Arubakku Kohporehiosentah; Nippon Mining Co., Ltd.; Ishikawajima-Harima Jukogyo Kabushiki Kaisha; International Superconductivity Technology Center, all of Japan

[21] Appl. No.: 624,219

[22] Filed: Dec. 10, 1990

[30] Foreign Application Priority Data

Dec. 11, 1989 [JP] Japan .................................. 1-321103

[51] Int. Cl.$^5$ ........................ C01F 11/02; C01F 17/00; C01G 3/02
[52] U.S. Cl. ................................. 505/445; 423/593; 501/12; 505/735; 505/490
[58] Field of Search ..................... 505/1, 734, 735; 501/12; 423/593

[56] References Cited

U.S. PATENT DOCUMENTS

| | | | |
|---|---|---|---|
| 4,845,056 | 7/1989 | Yamanis | 501/152 |
| 4,853,207 | 8/1989 | Wautier | 501/12 |
| 4,957,725 | 9/1990 | Potember | 501/12 |
| 4,962,082 | 10/1990 | Barboux | 505/735 |
| 4,962,088 | 10/1990 | Micheli et al. | 505/1 |
| 4,983,577 | 1/1991 | Mantese et al. | 505/1 |
| 5,001,110 | 3/1991 | Nonaka | 505/735 |
| 5,182,255 | 1/1993 | Budd | 505/1 |

FOREIGN PATENT DOCUMENTS

| | | | |
|---|---|---|---|
| 0052075 | 2/1989 | Japan | 505/734 |
| 0052613 | 2/1989 | Japan | 505/734 |
| 2-030615 | 2/1990 | Japan | |

OTHER PUBLICATIONS

Cava "Synthesis of Bulk Superconducting $YBa_2Cu_4O_8$ ..." *Nature* v. *338* Mar. 23, 1989 pp. 328-330.
Miyatake "$T_c$ Increased to 90 K in $YBa_2Cu_4O_8$ by ..." *Nature* v. 341 Sep. 7, 1989 pp. 41-42.
Morris "Bulk Synthesis and Thermodynamic Stability ..." Preprint Jan. 29, 1989.

*Primary Examiner*—Paul Lieberman
*Assistant Examiner*—John Boyd
*Attorney, Agent, or Firm*—Lorusso & Loud

[57] ABSTRACT

A method of producing a superconductor of metal oxides having the following composition:

$$(M_{1-x}Ca_x)(Ba_{1-y}Sr_y)_2Cu_4O_8$$

wherein M stands for a rare earth element, x is 0 or a positive number of less than 1 and y is 0 or a positive number of less than 1, is disclosed, which includes hydrolyzing an organic solvent solution or dispersion containing (a) alkoxide or fine particulate of a hydroxide of the rare earth element M, (b) alkoxides or fine particulate of hydroxides of Ca, Ba and Sr and (c) alkoxide, nitrate or fine particulate of hydroxide of copper in presence of water and nitrate ions. The alkoxides or hydroxides of Ca and Sr are present only when x and y are not zero, respectively. The hydrolyzed product is then dried, shaped and pyrolyzed to obtain the superconductor.

3 Claims, 2 Drawing Sheets

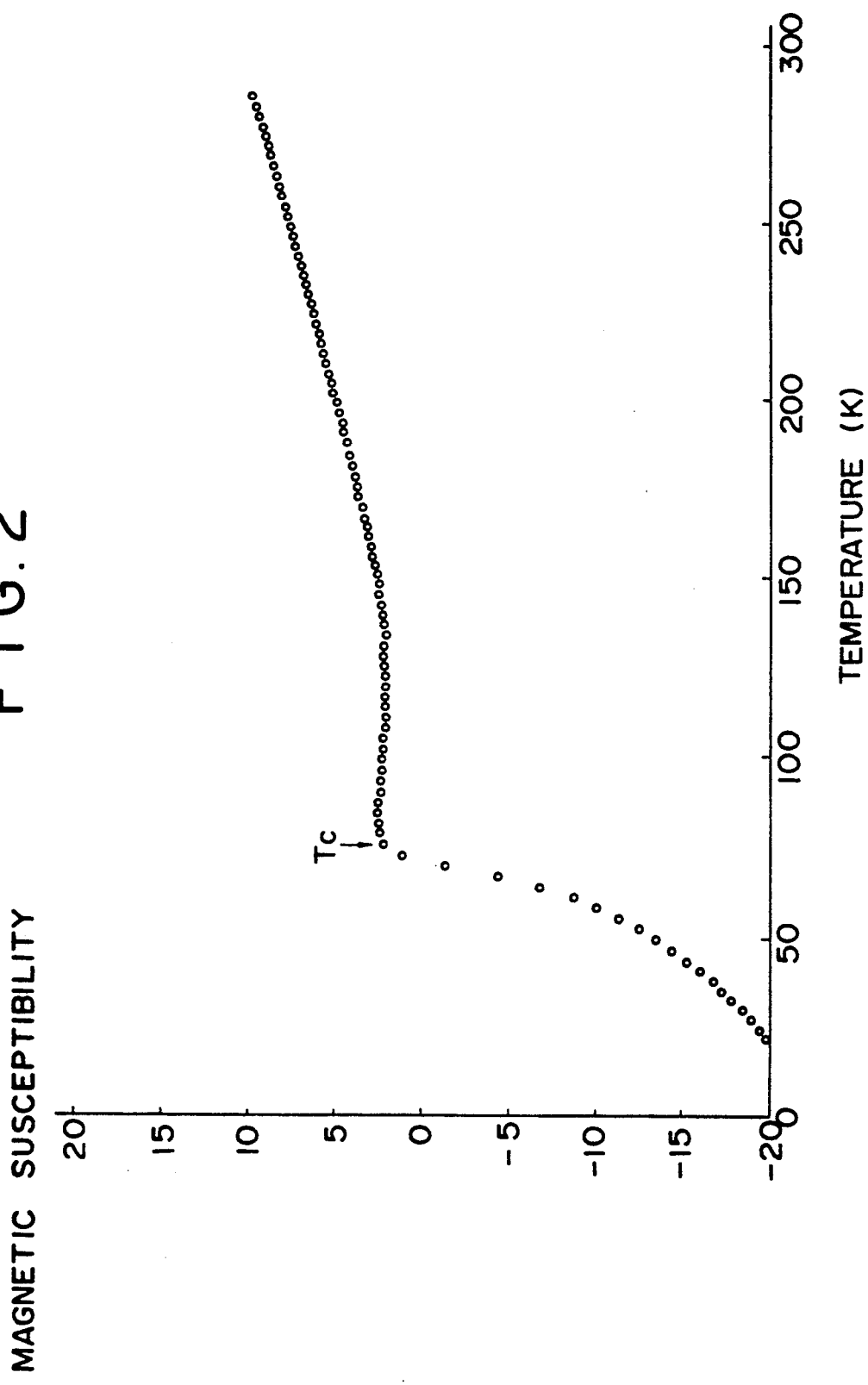

METHOD OF PRODUCING YBA₂CU₄O_x-TYPE SUPERCONDUCTING METAL OXIDES

BACKGROUND OF THE INVENTION

This invention relates generally to a method of producing a superconductor having a MBa$_2$Cu$_4$O$_8$ (M=a rare earth element) crystallographic phase and, more specifically, to a method of producing a superconductor of metal oxides having the following composition: (M$_{1-x}$Ca$_x$)(Ba$_{1-y}$Sr$_y$)$_2$Cu$_4$O$_8$ where M is the same as above and x and y each represent a positive number of less than 1.

THE PRIOR ART

There is a known superconducting material composed of MBa$_2$Cu$_4$O$_8$ (M=rare earth element). This material has a superconducting transition temperature Tc higher than the boiling point (77 K) of liquid nitrogen and is so stable that it does not decrease in oxygen content at temperatures up to about 850° C.

Such a superconductor has been hitherto prepared by a method which includes pyrolyzing a mixture of raw materials having a composition corresponding to that of the superconductor at a temperature of 930° C. and an oxygen pressure of 100 atm for 8 hours (Nature 336, 660-662 (1988)) or a method in which similar raw material composition is pyrolyzed at a temperature of 800° C. or less for 50 hours or more in the presence of a sodium carbonate catalyst (Nature 338, 323-330 (1989)). These known methods, however, have a problem from the industrial point of view because, in the former method, the pyrolysis must be performed at a high oxygen pressure and, in the latter method, the pyrolysis requires a long period of time and the catalyst contaminates the final superconductor.

SUMMARY OF THE INVENTION

The present invention has been made with the foregoing problems of the conventional methods in view and provides an industrially applicable method for the production of a high Tc superconductor.

In accordance with one aspect of the present invention there is provided a method of producing a superconductor of metal oxides having the following composition:

(M$_{1-x}$Ca$_x$)(Ba$_{1-y}$Sr$_y$)$_2$Cu$_4$O$_8$ wherein M stands for a rare earth element, x is 0 or a positive number of less than 1 and y is 0 or a positive number of less than 1, comprising the steps of:

subjecting an organic solvent solution containing (a) an alkoxide of the rare earth element M, (b) alkoxides of Ca, Ba and Sr and (c) a copper alkoxide or cupric nitrate to hydrolysis in the presence of water and nitrate ions, thereby forming a hydrolyzed product, said alkoxides of Ca and Sr being present only when x and y are not zero, respectively;

removing the solvent from said hydrolyzed product to obtain amorphous powder;

shaping said powder to form a shaped body; and pyrolyzing said shaped body at a temperature of 700°-850° C. and a pressure of 0.1-10 atm and in an oxidizing atmosphere to form the superconductor.

In another aspect, the present invention provides a method of producing a superconductor of metal oxides having the following composition:

(M$_{1-x}$Ca$_x$)(Ba$_{1-y}$Sr$_y$)$_2$Cu$_4$O$_8$ wherein M stands for a rare earth element, x is 0 or a positive number of less than 1 and y is 0 or a positive number of less than 1, comprising the steps of:

subjecting an organic solvent solution containing (a) an alkoxide of the rare earth element M, (b) alkoxides of Ca, Ba and Sr and (c) a copper alkoxide or cupric nitrate to hydrolysis in the presence of water and nitrate ions, thereby forming a hydrolyzed product, said alkoxides of Ca and Sr being present only when x and y are not zero, respectively;

shaping said hydrolyzed product to form a shaped body; and pyrolyzing said shaped body at a temperature of 700°-850° C. and a pressure of 0.1-10 atm and in an oxidizing atmosphere to form the superconductor.

In another aspect, the present invention provides a method of producing a superconductor of metal oxides having the following composition:

(M$_{1-x}$Ca$_x$)(Ba$_{1-y}$Sr$_y$)$_2$Cu$_4$O$_8$ wherein M stands for a rare earth element, x is 0 or a positive number of less than 1 and y is 0 or a positive number of less than 1, comprising the steps of:

subjecting an organic solvent solution containing (a) an alkoxide of the rare earth element M, (b) alkoxides of Ca, Ba and Sr and (c) a copper alkoxide or cupric nitrate to hydrolysis in the presence of water and nitrate ions, thereby forming a hydrolyzed product, said alkoxides of Ca and Sr being present only when x and y are not zero, respectively;

shaping said hydrolyzed product to form a shaped body; and pyrolyzing said shaped body at a temperature of 700°-850° C. and a pressure of 0.1-10 atm and in an oxidizing atmosphere to form the superconductor.

In a further aspect, the present invention provides a method of producing a superconductor of metal oxides having the following composition:

(M$_{1-x}$Ca$_x$)(Ba$_{1-y}$Sr$_y$)$_2$Cu$_4$O$_8$ wherein M stands for a rare earth element, x is 0 or a positive number of less than 1 and y is 0 or a positive number of less than 1, comprising the steps of:

subjecting an organic solvent dispersion containing (a) an alkoxide of the rare earth element M dissolved in the solvent, (b) alkoxides of Ca, Ba and Sr dissolved in the solvent and (c) fine particulate of copper hydroxide to hydrolysis in the presence of water and nitrate ions, thereby forming a hydrolyzed product, said alkoxides of Ca and Sr being present only when x and y are not zero, respectively;

removing the solvent from said hydrolyzed product to obtain amorphous powder, shaping said powder to form a shaped body; and pyrolyzing said shaped body at a temperature of 700°-850° C. and a pressure of 0.1-10 atm and in an oxidizing atmosphere to form the superconductor.

The present invention also provides a method of producing a superconductor of metal oxides having the following composition:

wherein M stands for a rare earth element, x is 0 or a positive number of less than 1 and y is 0 or a positive number of less than 1, comprising the steps of:

subjecting an organic solvent dispersion containing (a) fine particulate of a hydroxide of the rare earth element M, (b) alkoxides of Ca, Ba and Sr dissolved in the solvent and (c) fine particulate of copper hydroxide to hydrolysis in the presence of water and nitrate ions, thereby forming a hydrolyzed product, said alkoxides of Ca and Sr being present only when x and y are not zero, respectively;

removing the solvent from said hydrolyzed product to obtain amorphous power;

shaping said powder to form a shaped body; and pyrolyzing said shaped body at a temperature of 700°-850° C. and a pressure of 0.1-10 atm and in an oxidizing atmosphere to form the superconductor.

The present invention further provides a method of producing a superconductor of metal oxides having the following composition:

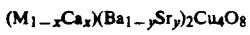

wherein M stands for a rare earth element, x is 0 or a positive number of less than 1 and y is 0 or a positive number of less than 1, comprising the steps of:

mixing an organic solvent, (a) fine particulate of a hydroxide of the rare earth element M, (b) fine particulate of hydroxides of Ca, Ba and Sr and (c) fine particulate of copper with water and nitrate ions, thereby forming a said hydroxides of Ca and Sr being present only when x and y are not zero, respectively;

removing the solvent from said gel to obtain amorphous powder;

shaping said powder to form a shaped body; and pyrolyzing said shaped body at a temperature of 700°-850° C. and a pressure of 0.1-10 atm and in an oxidizing atmosphere to form the superconductor.

BRIEF DESCRIPTION OF THE DRAWINGS

The present invention will now be described in detail below with reference to the accompanying drawings, in which:

FIG. 2 is a graph showing superconductivity characteristics in terms of magnetic susceptibility of the superconductor obtained in Example 1.

DESCRIPTION OF THE PREFERRED EMBODIMENTS

Figure 1:
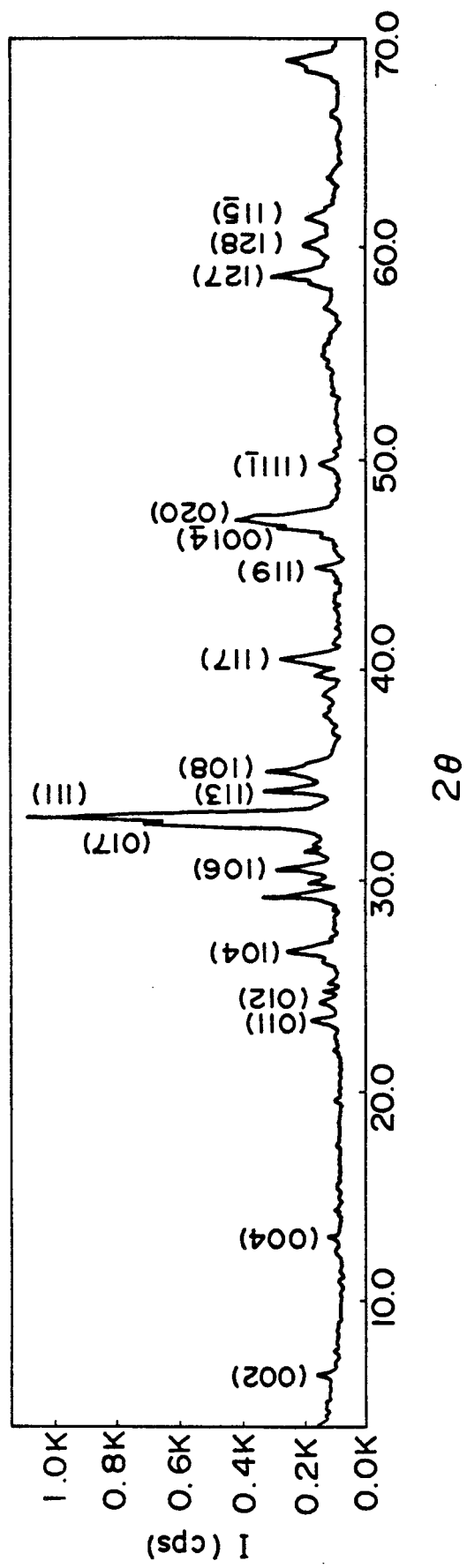
FIG. 1 is a powder X-ray diffraction pattern of $YBa_2Cu_4O_8$ obtained in Example 1.

In one preferred method according to the present invention, an organic solvent solution containing (a) a rare earth alkoxide, (b) one or more alkaline earth metal alkoxides and (c) copper alkoxide or cupric nitrate is first prepared.

As the rare earth element to be used in the ingredient (a), Y or La is preferably used. If desired, there may be used Sc, Nd, Sm, Eu, Gd, Dy, Ho, Er, Yb, Lu or the like rare earth element. As the alkaline earth metal to be used in the ingredient (b), Ba is used. If desired, Ba is used in conjunction with Sr and/or Ca. As the alcohol for the formation of the alkoxide group in the ingredients (a)–(c), monohydric alcohols such as methanol, ethanol, butanol and hexanol and dialcohols such as ethylene glycol and propylene glycol may be suitably used.

The organic solvent solution may be prepared by dissolving the ingredients (a)–(c) in a common solvent or by first dissolving respective ingredients (a)–(c) in different solvents and mixing the resulting solutions. The preferred method for the preparation of the organic solvent solution includes first dissolving the ingredients (a) and (b) in a solvent to form a first, homogeneous solution with which is then mixed a second solution containing cupric nitrate. This method is advantageous because cupric nitrate can provide nitrate ions and because the concentration of cupric nitrate in the second solution can be made high.

Illustrative of suitable organic solvents for the preparation of the organic solvent solution containing the ingredients (a)–(c) are ethanol, isopropanol, butanol, dioxane, tetrahydrofuran, benzene, toluene, xylene and ethylbenzene.

The contents and the kinds of the ingredients (a)–(c) are so determined as to provide the desired metal oxides. For example, when a superconductor of metal oxides $YBa_2Cu_4O_8$ is to be produced, an organic solvent solution containing an yttrium alkoxide, a barium alkoxide and cupric nitrate (or a copper alkoxide) and having contents of the yttrium and barium alkoxides of about 1 mole and 2 moles, respectively, per 3 moles of cupric nitrate (or copper alkoxide) is prepared.

The thus prepared organic solvent solution containing the ingredients (a)–(c) is then subjected to hydrolysis in the presence of water and nitrate ions, thereby forming a hydrolyzed product. The content of water in the reaction mixture to be hydrolyzed is generally 0.2–5 moles, preferably 0.5–2 mole, per mole of the total of ingredients (a)–(c). The content of nitrate ions in the reaction mixture to be hydrolyzed is generally 0.5–5 moles, preferably 1–2 moles per mole of the total of the ingredients (a)–(c). The nitrate ions and water may be provided by addition of aqueous nitric acid to the organic solvent solution or may be derived from $Cu(NO_3)_2 \cdot 3H_2O$ added as the ingredient (c). The hydrolysis is generally performed at a temperature from room temperature up to the boiling point of the organic solvent for a period sufficient to form a gel-like hydrolyzed mixture, generally 5–72 hours.

The hydrolyzed product is processed for the removal of the solvent therefrom to obtain amorphous powder. The removal of the solvent may be effected by any known method such as distillation at ambient or an elevated temperature under ambient or a reduced pressure. This powder whose primary particles generally have a particle size of 0.1 μm or less may be used as a precursor for the preparation of superconductors. Thus, the powder is shaped to form a shaped body which is then pyrolyzed to form a superconductor of oxides of the metals of the ingredients (a)–(c). The term "shaped body" used in the present specification and appended claims is intended to refer to wires, powders, filaments, fibers, plates, blocks, pipes, films, coatings and the like molded bodies and composite articles using these materials.

Alternatively, the hydrolyzed product is formed into a desired shaped body, which is then dried and pyrolyzed to form a superconductor. A molding aid formed of a polymeric substance such as carboxymethylcellulose or polyvinyl alcohol may be mixed with the hydrolyzed product.

When the hydrolyzed product or the amorphous powder obtained therefrom is used for the formation of coatings, it is applied over a surface of a substrate. The coated substrate is then heated to effect pyrolysis, thereby to give a composite article having a superconducting surface. The substrate may be formed of an elemental metal such as copper or silver; an alloy such as stainless steel; a metal oxide such as alumina, zirconia, magnesia or strontium titanate; a ceramic material such as silicon carbide; or graphite. The substrate may be in the form of a plate, a block, a coil, a fiber, a fabric, a pipe, a rod or the like shaped body.

The pyrolysis is performed at a temperature of 700°–850° C. and a pressure of 0.1–10 atm, preferably 0.5–2 atm in an oxidizing atmosphere such as an oxygen-containing atmosphere, e.g. air. Since, in the method according to the present invention, the formation of metal carbonates with high decomposition temperatures, such as alkaline earth metal carbonate, can be avoided, the pyrolysis is advantageously carried out at a relatively low temperature. Presumably, a portion of the nitrate ions is incorporated into the hydrolysis product to form an alkaline earth metal nitrate with a relatively low decomposition temperature. The nitrate ion thus bound to the alkaline earth metal would prevent the contact between carbonate ions and the alkaline earth metal and, hence, the formation of an alkaline earth metal carbonate during the course of the pyrolysis.

In another preferred embodiment of the present invention, an organic solvent dispersion containing (a) a rare earth alkoxide dissolved in the solvent, (b) one or more alkaline earth metal alkoxides dissolved in the solvent and (c) fine particulate of copper hydroxide is first prepared.

As the ingredients (a) and (b), those used in the above-described first embodiment may be used. The ingredient (c) may be suitably obtained by hydrolysis of a copper salt solution to precipitate the copper as copper hydroxide. Examples of suitable copper salts include copper sulfate, copper nitrate and copper chloride. The dispersion is preferably obtained by mixing an organic solvent solution containing the ingredients (a) and (b) with an organic solvent dispersion containing the ingredient (c).

The thus prepared organic solvent dispersion is then subjected to hydrolysis in the presence of water and nitrate ions, thereby forming a hydrolyzed product in the form of a gel. The hydrolyzed product is processed for the removal of the solvent therefrom to obtain amorphous powder whose primary particles generally have a particle size of 0.1 μm or less and which may be used as a precursor for the preparation of superconductors.

In a third, preferred embodiment of the present invention, an organic solvent dispersion containing (a) fine particulate of a rare earth element hydroxide, (b) one or more alkaline earth metal alkoxides dissolved in the solvent and (c) fine particulate of copper hydroxide is first prepared.

As the ingredient (b), those used in the above-described first embodiment may be used. The ingredients (a) and (c) may be suitably obtained by hydrolysis of salts (e.g. sulfates, nitrates and chlorides) of a rare earth element and copper, respectively, to precipitate the rare earth element and copper as hydroxides. The dispersion is preferably obtained by mixing an organic solvent solution containing the ingredient (b) with organic solvent dispersions containing the ingredients (a) and (c).

The thus prepared organic solvent dispersion is then subjected to hydrolysis in the presence of water and nitrate ions, thereby forming a hydrolyzed product in the form of a gel. The hydrolyzed product is processed for the removal of the solvent therefrom to obtain amorphous powder whose primary particles generally have a particle size of 0.1 μm or less and which may be used as a precursor for the preparation of superconductors.

In a fourth, preferred embodiment of the present invention, an organic solvent dispersion containing (a) fine particulate of a rare earth element hydroxide, (b) fine particulate of one or more alkaline earth metal hydroxides and (c) fine particulate of copper hydroxide is first prepared. These ingredients (a)–(c) may be suitably obtained by hydrolysis of salts (e.g. sulfates, nitrates and chlorides) of a rare earth element, one or more alkaline earth metals and copper, respectively, to precipitate the rare earth element, alkaline earth metals and copper as hydroxides. The dispersion is preferably obtained by mixing organic solvent dispersions containing the ingredients (a)–(c).

The thus prepared organic solvent dispersion is then mixed with water and nitrate ions, thereby forming a gel. The gel is processed for the removal of the solvent therefrom to obtain amorphous powder whose primary particles generally have a particle size of 0.1 μm or less and which may be used as a precursor for the preparation of superconductors.

In the above embodiments, the term "fine particulate" is intended to refer to particles having a particle size of 1 μm or less, preferably 0.03–0.5 μm.

The following examples will further illustrate the present invention.

EXAMPLE 1

A solution of yttrium butoxide in xylene, a solution of barium ethoxide in ethanol and a solution of cupric nitrate ($Cu(NO_3)_2 \cdot 3H_2O$) in ethanol were mixed with each other to obtain a raw material solution having an atomic ratio of Y:Ba:Cu of 1:2:4. The raw material solution which contained water in an amount of about 1.7 mol per mol of the total of the metals was then reacted at about 60° C. for 20 hours under reflux in a nitrogen atmosphere with stirring, to obtain a hydrolyzed product mixture containing a gel-like substance. This mixture was evaporated to dryness for the removal of the solvents with heating to obtain amorphous superfine powder.

The amorphous powder was heated to 800° C. at a heating rate of 1° C./minute under oxygen stream of 1 atm and maintained at that temperature for 10 hours. The powder X-ray diffraction analysis of the resultant product is shown in FIG. 1, from which it is seen that the product has a $YBa_2Cu_4O_8$ crystal phase. The magnetic susceptibility of the product is shown in FIG. 2, from which it is seen that the product is a superconductor having Tc of 80 K.

EXAMPLE 2

The amorphous powder obtained in Example 1 was dispersed in acetone and the dispersion was uniformly applied over a surface of MgO substrate. The coating was then calcined at 800° C. for 10 hours in the atmosphere of oxygen, thereby obtaining a composite article having a superconductor film having $YBa_2Cu_4O_8$ crystal phase.

EXAMPLE 3

The gel-like substance-containing mixture obtained in Example 1 was applied over a surface of MgO substrate and dried. The dried coating was then calcined at 800° C. for 10 hours in the atmosphere of oxygen, thereby obtaining a composite article having a superconductor film having $YBa_2Cu_4O_8$ crystal phase.

EXAMPLE 4

Ammonia gas was bubbled through a solution of copper nitrate dissolved in ethanol to obtain fine particulate of copper hydroxide as precipitates. The precipitates were washed with water and dispersed in ethanol to obtain a dispersion. This dispersion was then mixed with a solution of yttrium butoxide in xylene and a solution of barium ethoxide in ethanol to obtain an organic solvent dispersion having an atomic ratio of Y:Ba:Cu of 1:2:4. After addition of nitric acid, the dispersion was hydrolyzed in the same manner as that in Example 1 to obtain a hydrolyzed product mixture containing a gel-like substance. This mixture was evaporated to dryness for the removal of the solvents with heating to obtain amorphous superfine powder. The pyrolysis of the powder was effected in the same manner as that in Example 1 to give a superconductor having $YBa_2Cu_4O_8$ crystal phase.

EXAMPLE 5

Yttrium nitrate was added to an aqueous ethanol to hydrolyze the nitrate and thereby to obtain a first dispersion containing fine particulate of yttrium hydroxide. Barium nitrate was added to an aqueous ethanol to hydrolyze the nitrate and thereby to obtain a second dispersion containing fine particulate of barium hydroxide. Ammonia gas was bubbled through a solution of copper nitrate dissolved in ethanol, thereby to obtain fine particulate of copper hydroxide as precipitates. The precipitates were washed with water and dispersed in ethanol to obtain a third dispersion. The first through third dispersions and were mixed with each other to obtain a fourth dispersion having an atomic ratio of Y:Ba:Cu of 1:2:4. After addition of nitric acid, the fourth dispersion was gel at a temperature of 60° C. for 20 hours to obtain a product mixture containing a gel-like substance. This mixture was evaporated to dryness for the removal of the solvents with heating to obtain amorphous superfine powder. The pyrolysis of the powder was effected in the same manner as that in Example 1 to give a superconductor having $YBa_2Cu_4O_8$ crystal phase.

EXAMPLE 6

Yttrium nitrate was added to an aqueous ethanol to hydrolyze the nitrate and thereby to obtain a first dispersion containing fine particulate of yttrium hydroxide. Ammonia gas was bubbled through a solution of copper nitrate dissolved in ethanol, thereby to obtain fine particulate of copper hydroxide as precipitates. The precipitates were washed with water and dispersed in ethanol to obtain a second dispersion. The first and second dispersions and were mixed with each other to obtain a third dispersion having an atomic ratio of Y:Cu of 1:4 to which was added metallic barium. The barium was reacted with ethanol to form barium ethoxide to give a third dispersion having an atomic ratio of Y:Ba:Cu of 1:2:4. After addition of nitric acid, the third dispersion was hydrolyzed at a temperature of 60° C. for 20 hours to obtain a hydrolyzed product mixture containing a gel-like substance. This mixture was evaporated to dryness for the removal of the solvents with heating to obtain amorphous superfine powder. The pyrolysis of the powder was effected in the same manner as that in Example 1 to give a superconductor having $YBa_2Cu_4O_8$ crystal phase.

EXAMPLE 7

A solution of yttrium butoxide in xylene, a solution of barium ethoxide in ethanol, a solution of calcium ethoxide in ethanol and a solution of cupric nitrate ($Cu(NO_3)_2 \cdot 3H_2O$) in ethanol were mixed with each other to obtain a raw material solution having an atomic ratio of Y:Ca:Ba:Cu of 0.9:0.1:2:4. The raw material solution was reacted at about 60° C. for 20 hours under reflux in a nitrogen atmosphere with stirring, to obtain a hydrolyzed product mixture containing a gel-like substance. This mixture was evaporated to dryness for the removal of the solvents with heating to obtain amorphous superfine powder. The pyrolysis of the powder was effected in the same manner as that in Example 1 to give a superconductor having $Y_{0.9}Ca_{0.1}Ba_2Cu_4O_8$ crystal phase.

EXAMPLE 8

A solution of yttrium butoxide in xylene, a solution of barium ethoxide in ethanol, a solution of strontium ethoxide in ethanol and a solution of cupric nitrate ($Cu(NO_3)_2 \cdot 3H_2O$) in ethanol were mixed with each other to obtain a raw material solution having an atomic ratio of Y:Ba:Sr:Cu of 1:1:1:4. The raw material solution was reacted at about 60° C. for 20 hours under reflux in a nitrogen atmosphere with stirring, to obtain a hydrolyzed product mixture containing a gel-like substance. This mixture was evaporated to dryness for the removal of the solvents with heating to obtain amorphous superfine powder. The pyrolysis of the powder was effected in the same manner as that in Example 1 to give a superconductor having $YBaSrCu_4O_8$ crystal phase.

What is claimed is:

1. A method of producing a superconductor of metal oxides having the following composition:

$$(M_{1-x}Ca_x)(Ba_{1-y}Sr_y)_2Cu_4O_8$$

wherein M stands for a rare earth element, x is 0–0.1 and y is 0 or a positive number of less than 1, comprising the steps of:

subjecting an organic solvent solution containing (a) an alkoxide of the rare earth element M, (b) alkoxides of Ca, Ba and Sr and (c) cupric nitrate to hydrolysis in the presence of 12/7–2.0 moles of water per mole of combined (a), (b) and (c) and nitrate ions, thereby forming a hydrolyzed product, said alkoxides of Ca and Sr being present only when x and y are not zero, respectively;

removing the solvent from said hydrolyzed product to obtain amorphous powder;

shaping said powder to form a shaped body; and pyrolyzing said shaped body at a temperature of 700°–850° C. and a pressure of 0.1–10 atm. and in an oxidizing atmosphere to form the superconductor.

2. A method as set forth in claim 1, wherein said shaping step comprises coating said amorphous powder over a surface of a substrate to form said shaped body in the form of a coating.

3. A method of producing a superconductor of metal oxides having the following composition:

$$(M_{1-x}Ca_x)(Ba_{1-y}Sr_y)_2Cu_4O_8$$

wherein M stands for a rare earth element, x is 0–0.1 and y is 0 or a positive number of less than 1, comprising the steps of:

subjecting an organic solvent solution containing (a) an alkoxide of the rare earth element M, (b) alkoxides of Ca, Ba and Sr and (c) cupric nitrate to hydrolysis in the presence of 12/7–2.0 moles of water per mole of combined (a), (b) and (c) and nitrate ions, thereby forming a hydrolyzed product, said alkoxides of Ca and Sr being present only when x and y are not zero, respectively;

shaping said hydrolyzed product to form a shaped body; and pyrolyzing said shaped body at a temperature of 700°–850° C. and a pressure of 0.1–10 atm. and in an oxidizing atmosphere to form the superconductor.

* * * * *

UNITED STATES PATENT AND TRADEMARK OFFICE
CERTIFICATE OF CORRECTION

PATENT NO. : 5,306,696
DATED : April 26, 1994
INVENTOR(S) : MURAKAMI et al

It is certified that error appears in the above-indentified patent and that said Letters Patent is hereby corrected as shown below: Title page:

Item [54] and Col. 1, "$YBA_2CU_4O_x$-" should read --$YBa_2Cu_4O_x$---.

Col. 1, line 32, "323" should read --328--.

Col. 3, line 18, "power" should read --powder--; and line 36, after "a" insert --gel,--.

Signed and Sealed this

Eighteenth Day of April, 1995

*Attest:*

BRUCE LEHMAN

*Attesting Officer*   *Commissioner of Patents and Trademarks*